US012718902B1

(12) United States Patent
Solt

(10) Patent No.: US 12,718,902 B1
(45) Date of Patent: Aug. 25, 2026

(54) MEMORY TESTING INCLUDING TESTING OF ADDRESS LINES

(71) Applicant: Amazon Technologies, Inc., Seattle, WA (US)

(72) Inventor: Yosef Eyal Solt, Haifa (IL)

(73) Assignee: Amazon Technologies, Inc., Seattle, WA (US)

( * ) Notice: Subject to any disclaimer, the term of this patent is extended or adjusted under 35 U.S.C. 154(b) by 91 days.

(21) Appl. No.: 18/755,404

(22) Filed: Jun. 26, 2024

(51) Int. Cl.
*G11C 29/18* (2006.01)
*G11C 29/12* (2006.01)
*G11C 29/36* (2006.01)

(52) U.S. Cl.
CPC .......... *G11C 29/1201* (2013.01); *G11C 29/18* (2013.01); *G11C 29/36* (2013.01)

(58) Field of Classification Search
CPC ............................ G11C 29/1201; G11C 29/12
USPC ......................................................... 365/201
See application file for complete search history.

(56) References Cited

U.S. PATENT DOCUMENTS 6,981,188 B2 * 12/2005 Galzur ................... G11C 29/38 714/719
7,158,529 B2 * 1/2007 Halvarsson ............. H04L 69/08 370/428
2016/0351234 A1 * 12/2016 Perego ................ G06F 13/1678

* cited by examiner

*Primary Examiner* — Muna A Techane
(74) *Attorney, Agent, or Firm* — Klarquist Sparkman, LLP

(57) ABSTRACT

A memory test is proposed wherein a majority of the address lines are switched on every cycle. Increasing a number of switched address lines increases an ability to detect cross coupling problems between address lines and maximizes power usage to detect power issues. In one example, on every even cycle, the address lines use a first incrementing or decrementing pattern, while every odd cycle, the address lines use a second incrementing or decrementing pattern. The first pattern can be an opposite direction of counting than the second pattern, such that if one is incrementing, the other is decrementing or vice versa. The first and/or second pattern can be binary, Gray code, or other patterns.

19 Claims, 7 Drawing Sheets

| MEMORY TEST CYCLE | ADDRESS VALUE | DATA VALUE |
|---|---|---|
| 0 | PATTERN 1 | PATTERN 3 |
| 1 | PATTERN 2 | PATTERN 3 |
| 2 | PATTERN 1 | PATTERN 3 |
| 3 | PATTERN 2 | PATTERN 3 |
| 4 | PATTERN 1 | PATTERN 3 |
| 5 | PATTERN 2 | PATTERN 3 |
| 6 | PATTERN 1 | PATTERN 3 |
| 7 | PATTERN 2 | PATTERN 3 |
| 8 | PATTERN 1 | PATTERN 3 |
| 9 | PATTERN 2 | PATTERN 3 |
| 10 | PATTERN 1 | PATTERN 3 |
| 11 | PATTERN 2 | PATTERN 3 |
| 12 | PATTERN 1 | PATTERN 3 |
| 13 | PATTERN 2 | PATTERN 3 |
| ⋮ | ⋮ | ⋮ |
| N | PATTERN 1 | PATTERN 3 |

| MEMORY TEST CYCLE (110) | ADDRESS VALUE (120) | BINARY (210) | CHANGED BITS (220) | DATA UPPER BITS (230) | DATA LOWER BITS (240) |
|---|---|---|---|---|---|
| 0 | 0 | 0 | 8 | 000 | 0 |
| 1 | 255 | 11111111 | 7 | 111 | 255 |
| 2 | 2 | 10 | 8 | 000 | 2 |
| 3 | 253 | 11111101 | 6 | 111 | 253 |
| 4 | 4 | 100 | 8 | 000 | 4 |
| 5 | 251 | 11111011 | 7 | 111 | 251 |
| 6 | 6 | 110 | 8 | 000 | 6 |
| 7 | 249 | 11111001 | 6 | 111 | 249 |
| 8 | 8 | 1000 | 8 | 000 | 8 |
| 9 | 247 | 11110111 | 7 | 111 | 247 |
| 10 | 10 | 1010 | 8 | 000 | 10 |
| 11 | 245 | 11110101 | 6 | 111 | 245 |
| 12 | 12 | 1100 | 8 | 000 | 12 |
| 13 | 243 | 11110011 | 7 | 111 | 243 |

•••

320
300
310
PROCESSOR
DATA
370
340
CYCLE TRACKING
350
MEMORY
330
342
REGISTER FOR EVEN CYCLES OF MEMORY TEST
ADDRESS
344
ADDRESS DECODER
ADDRESS
360
REGISTER FOR ODD CYCLES OF MEMORY TEST
332
COMPARATOR
380

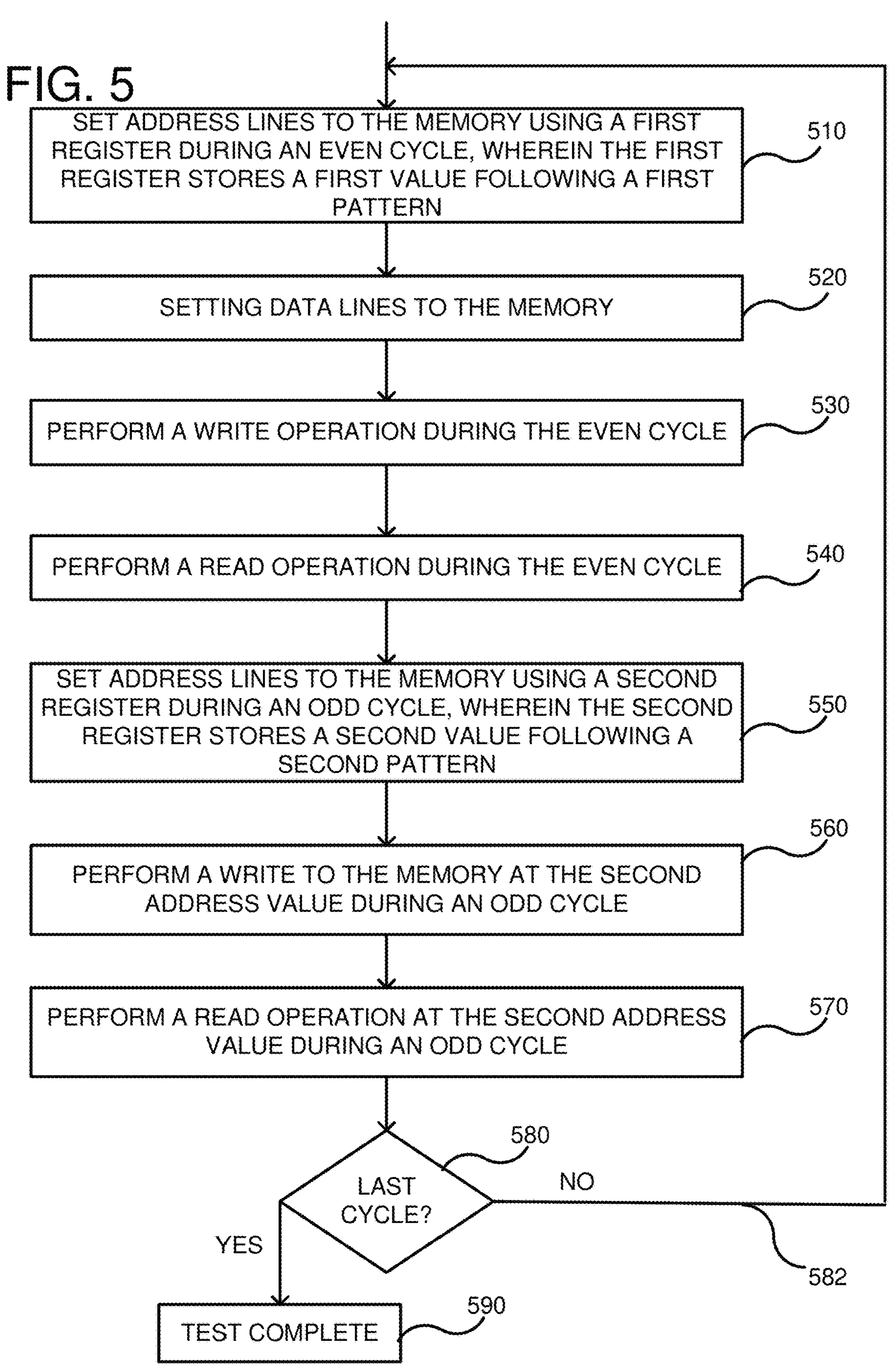
FIG. 5
SET ADDRESS LINES TO THE MEMORY USING A FIRST REGISTER DURING AN EVEN CYCLE, WHEREIN THE FIRST REGISTER STORES A FIRST VALUE FOLLOWING A FIRST PATTERN
510
SETTING DATA LINES TO THE MEMORY
520
PERFORM A WRITE OPERATION DURING THE EVEN CYCLE
530
PERFORM A READ OPERATION DURING THE EVEN CYCLE
540
SET ADDRESS LINES TO THE MEMORY USING A SECOND REGISTER DURING AN ODD CYCLE, WHEREIN THE SECOND REGISTER STORES A SECOND VALUE FOLLOWING A SECOND PATTERN
550
PERFORM A WRITE TO THE MEMORY AT THE SECOND ADDRESS VALUE DURING AN ODD CYCLE
560
PERFORM A READ OPERATION AT THE SECOND ADDRESS VALUE DURING AN ODD CYCLE
570
LAST CYCLE?
580
NO
582
YES
TEST COMPLETE
590

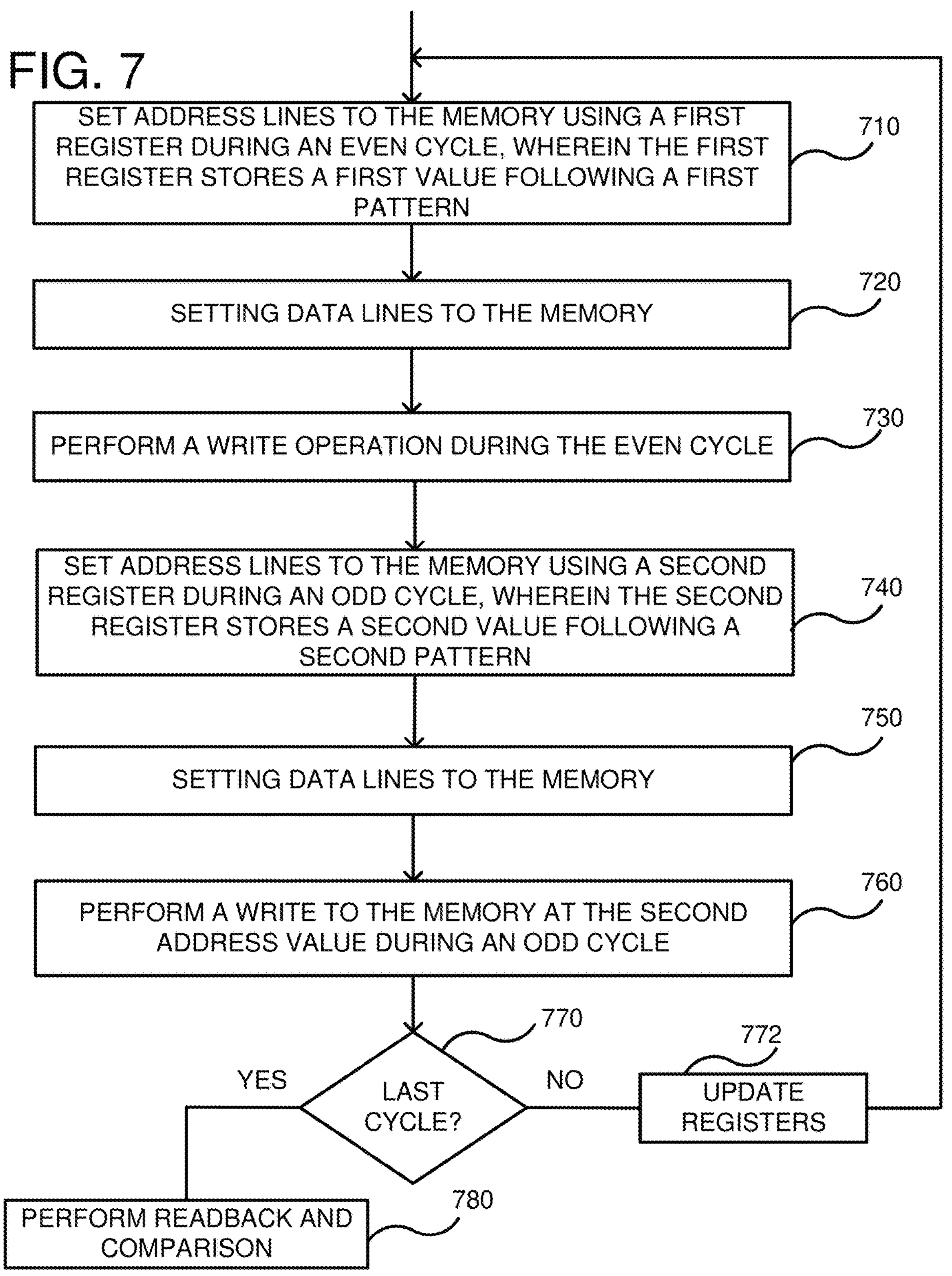
FIG. 7
SET ADDRESS LINES TO THE MEMORY USING A FIRST REGISTER DURING AN EVEN CYCLE, WHEREIN THE FIRST REGISTER STORES A FIRST VALUE FOLLOWING A FIRST PATTERN
710
SETTING DATA LINES TO THE MEMORY
720
PERFORM A WRITE OPERATION DURING THE EVEN CYCLE
730
SET ADDRESS LINES TO THE MEMORY USING A SECOND REGISTER DURING AN ODD CYCLE, WHEREIN THE SECOND REGISTER STORES A SECOND VALUE FOLLOWING A SECOND PATTERN
740
SETTING DATA LINES TO THE MEMORY
750
PERFORM A WRITE TO THE MEMORY AT THE SECOND ADDRESS VALUE DURING AN ODD CYCLE
760
LAST CYCLE?
770
YES
NO
UPDATE REGISTERS
772
PERFORM READBACK AND COMPARISON
780

MEMORY TESTING INCLUDING TESTING OF ADDRESS LINES

BACKGROUND

Memory testing is commonly used to push a memory (e.g., Random Access Memory (RAM)) to its limits to expose any potential weaknesses. For example, such memory testing can subject the memory to extreme conditions to provide insights into performance in demanding situations. Typically, to test the memory, a processor writes a pattern to the memory and reads the pattern back. A comparison is then made between what was written and what was read. Any discrepancies can signify a faulty memory, such as a data bit stuck at a value.

Typically, the memory testing includes writing different patterns to the memory to ensure each memory bit is exercised with a "0" and "1" value, such as by using a walking 1s/0s pattern. The memory tests can be used to detect faulty memory modules, ensure system stability and help to diagnose and resolve potential memory issues before they cause significant problems.

Traditional memory testing has been excellent in terms of detecting memory bit errors, but there has been little attention in memory testing to other elements involved in a memory read/write.

BRIEF DESCRIPTION OF THE DRAWINGS

FIG. 2 is an example memory test wherein two specific patterns are used including an incrementing pattern and a decrementing pattern.

FIG. 5 is a flowchart according to another embodiment for testing the memory.

FIG. 7 is a flowchart according to another embodiment for testing memory using a full write to all addresses of memory and reading back from memory after the full write is completed.

DETAILED DESCRIPTION

Memory testing has often been performed to ensure that the memory can store 0s and 1s at every memory location. However, little memory testing has been performed to ensure that the address lines are adequately tested. For example, existing memory tests average changing only two memory address lines per cycle. A memory test is proposed wherein a majority of the address lines are switched on every cycle. Increasing a number of switched address lines increases an ability to detect cross-coupling problems between address lines and maximizes power usage to detect power issues.

In one example, every even cycle, the address lines use a first incrementing or decrementing pattern, while every odd cycle, the address lines use a second incrementing or decrementing pattern. The first pattern can be an opposite direction of counting than the second pattern, such that if one is incrementing, the other is decrementing or vice versa. The first and/or second pattern can be binary, Gray code, or other patterns.

Figure 1:
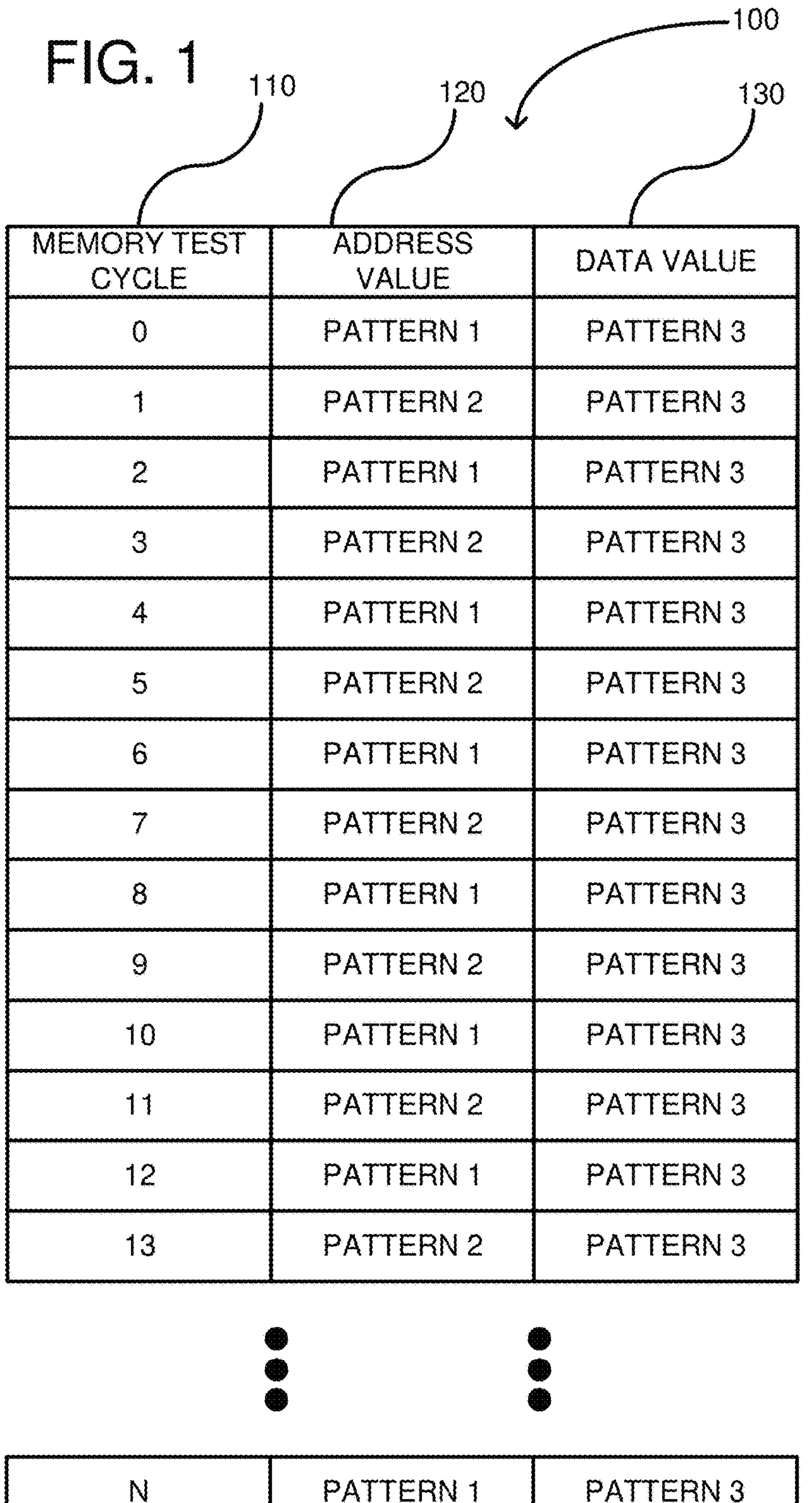
FIG. 1 is an example of a memory test wherein address values follow multiple patterns to ensure at least a majority of address bits change between testing cycles.

FIG. 1 shows a memory test 100 that has a plurality of write/read cycles 110 starting from cycle 0 until cycle N, where N is any integer value. During each cycle of the memory test 100, a different address value 120 and data value 130 are used to write the memory. The address value 120 can follow at least two different patterns. The patterns can be any desired number sequences. For example, pattern 1 can be an incrementing number sequence while pattern 2 can be a decrementing number sequence. The incrementing number sequence can increment by 1, 2, 3, or any desired integer number. Likewise, the decrementing number sequence can decrement by any integer number. A data value 130 is associated with each memory cycle 110 and can follow a different pattern 3, which is independent from the patterns used in the address value 120. The pattern 3 can be walking 0's, walking 1's or other data patterns used in memory testing to test all of the data bits associated with each memory address. As shown at 140, the patterns 1 and 2 are chosen such that at least a majority of the address bits switch from the previous cycle. Thus, the majority of bits on the address bus to the memory will switch from a 0 to a 1 or a 1 to a 0. In some embodiments, the average number of bits changing on the address lines is the maximum number of possible bits (i.e., the number of address bits) minus 1 or even minus 0.5. Thus, for an 8-bit address, on average, 7 address bits will change (i.e., 8-1). In some embodiments, where Gray code patterns are being used, the average for an 8-bit address is 7.5 address bits changing. By exercising the address bus with a high level of switching, cross talk and power consumption can be evaluated.

In some embodiments, the data value 130 can be a unique value for each address. One technique for achieving this is to divide the data into upper and lower portions, wherein the lower portion has a same number of bits as the address. The value in the upper portion can then be flipped every cycle, while the value in the lower portion can mimic the address. The lower portion can also contain other patterns, such as an incrementing pattern. In either case, each data value 130 can be a unique value corresponding to the address. Having a unique pattern for data ensures that the data value cannot be randomly correct. Having such a unique pattern improves the testing of the address lines.

FIG. 2 shows a particular example of the memory test 100, wherein 14 cycles of testing are shown, wherein each cycle includes at least a memory write operation. The address values in column 120 include two patterns. The first pattern is 0, 2, 4, 6, 8, 10, 12, etc. and occurs on even cycles. Thus, the first pattern is an incrementing sequence of numbers that increase by two and start at a minimum address of 0. The second pattern is 255, 253, 251, 249, etc. and occurs on odd cycles. Thus, the second pattern is a decreasing sequence of numbers that decrease by two and start at a maximum address of 255, as there are 8 address bits in this example. Column 210 shows the binary values of the addresses and column 220 shows how many of the address bits change between the previous and current cycles, in this case showing that either all of the address bits change on every cycle or 7 out of 8 bits change on every cycle, etc. Thus, on average, at least a majority of bits change on every cycle.

The data is made of two separate fields 230 (upper bits) and 240 (lower bits). The upper bits 230 can toggle every cycle, while the lower bits 240 mimic the address value 120. Together, the upper bits 230 and lower bits 240 represent the data value 130 written to the address shown in field 120. By using such a pattern of data, the address lines are stressed an increased amount and false reads are reduced.

Figure 3:
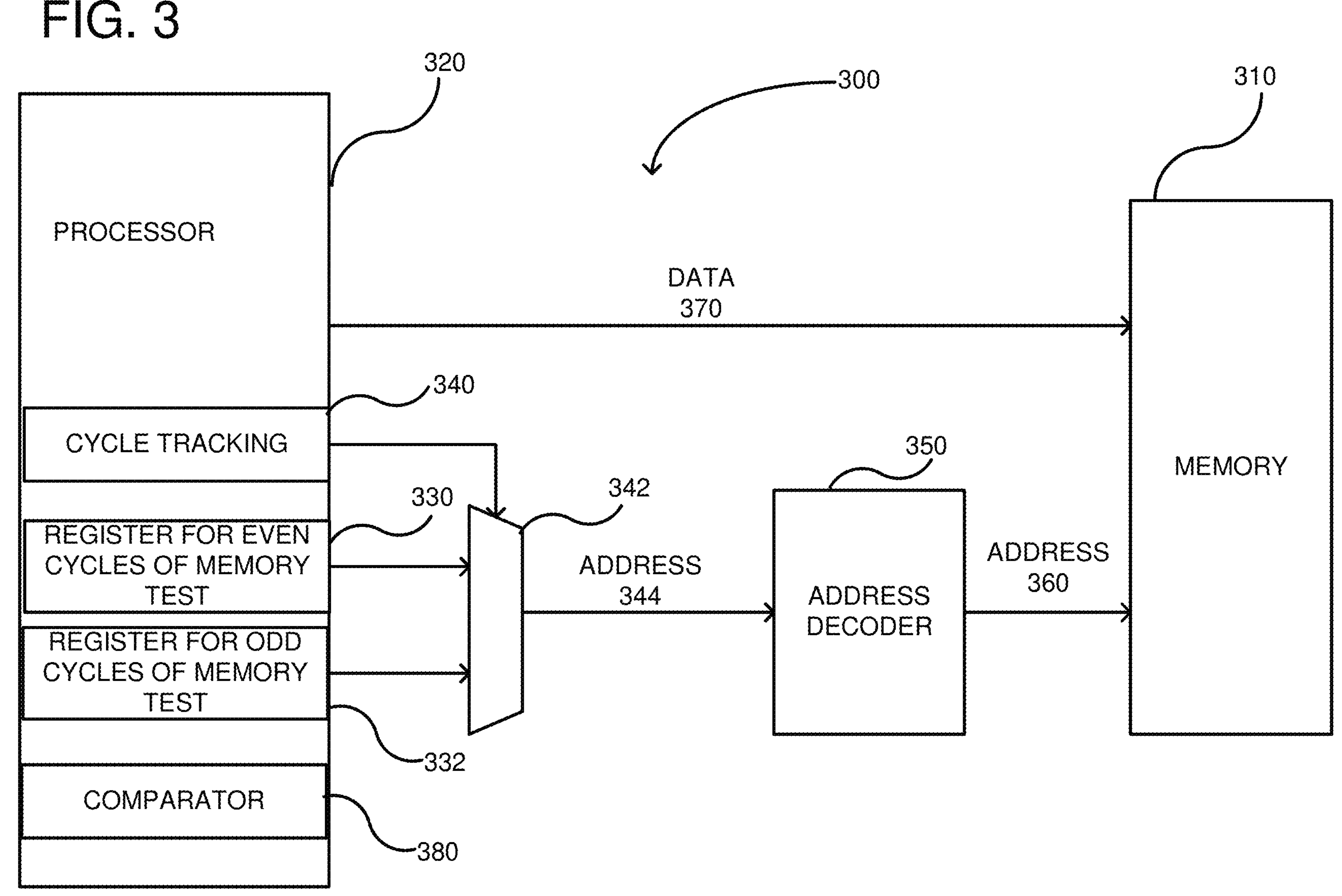
FIG. 3 is a hardware diagram of components that can be used to test a memory.

FIG. 3 shows an example hardware design 300 for testing a memory 310. A processor 320 can be a general-purpose central processing unit (CPU), processor in an application-specific integrated circuit (ASIC) or any other type of processor or controller. The processor 320 includes a first register 330 and a second register 332. The first register 330 can store the first pattern for even cycles of the memory test and the second register can store the second pattern for odd cycles of the memory test. Thus, for example, using the example of FIG. 2, the first register can start with the address value 0 at cycle 0 and every even memory cycle, the address in the first register 330 is incremented by 2. The second register 332 can store address values for the odd cycles, and every odd cycle, the address in the second register can be decremented by 2. A cycle tracking register 340 can switch a multiplexer 342 such that an address 344 switches every cycle between values in the first register 330 and the second register 332. An address decoder 350 can be used to decode the address 344 and provide a final address 360 to the memory 310. Data lines 370 can be used to write or read the contents of the memory 310 at the address 360. The processor 320 can write the data to the memory 310, read the data back from the memory and use a comparator 380 to ensure that the written data matches the data read. If they do not match, then the memory has an error. If they do match, then the next cycle of testing can occur. Although a specific hardware design is shown, other hardware designs can be used. In one example, the address decoder need not be used.

In an alternative embodiment, the processor 320 can have a single address output register that swaps between using the contents of registers 330, 332. In such a case, the multiplexer 342 can be eliminated. For example, software can be used to load the address output register and registers 330, 332 store variables used by the software. Still further, the hardware design 300 can be a Built-in-Self-Test (BIST) structure used to test memory after an IC is created.

Figure 4:
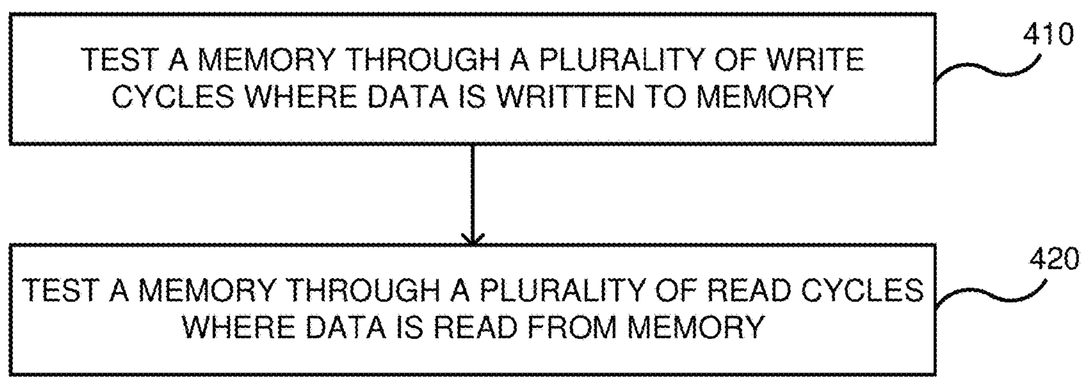
FIG. 4 is a flowchart according to one embodiment for testing the memory.

FIG. 4 is a flowchart of a method according to one embodiment. In process block 410, a memory is tested through a plurality of write cycles wherein data is written to memory. For example, in FIG. 2, a plurality of write cycles are shown in column 110. In FIG. 3, during each cycle, the data is written to memory at a memory location controlled by address 360. In process block 420, the memory is tested through a plurality of read cycles, where data is read from the memory. Thus, in FIG. 2, each memory test cycle 110 can include a write and a corresponding read. A comparison in comparator 380 can then be performed to check if there is agreement between what was written and what was read. On average, during each of the plurality of write cycles at least a majority of the address bits switch from one cycle to a next cycle. Thus, in FIG. 2, the address value from cycle 1 to cycle 2 changes 7 bits for an 8-bit address. For an 8-bit address, at least a majority means 5 bits or one more. Other sizes of address buses can be used.

FIG. 5 is a flowchart according to another embodiment for testing memory. In process block 510, address lines to a memory are set using a first register during an even cycle. The first register can be an address register that stores a first value following a first pattern. For example, in FIG. 3, the register 330 can be an address register that stores a pattern. One example pattern is shown in FIG. 2 where during even memory test cycles, the address values increment by 2 (i.e., 0, 2, 4, 6, etc.). Using the register 330, the address lines 360 to the memory 310 can be set. In process block 520, data lines are set to the memory. For example, in FIG. 3, the data lines 370 are set using any desired test data pattern. The data pattern used is not of importance. In process block 530, a write operation can be performed during an even cycle. In FIG. 3, after the address lines and data lines are set, a write operation can be performed to the memory. Although the control lines are not shown in FIG. 3, a write control line and read control line can extend from the processor 320 to the memory. In process block 540, a read operation is performed during the even cycle. For example, in FIG. 2, every memory test cycle 110 can include a write and a read operation. The memory address during the write and read operation can be the same address. The data written and read can be compared using the comparator (FIG. 3 at 380). In process block 550, address lines to the memory are set using a second register during an odd cycle. The second register can store a second value following a second pattern. For example, in FIG. 3, the register 332 can follow a different pattern than register 330. In FIG. 2, the second pattern is shown in odd cycles as a decrementing pattern (i.e., 255, 253, 251, etc.) The address lines 360 can be set by switching the multiplexer 342 using the cycle tracking register 340. In process block 560, the write operation is performed to the memory at the second address value set in process block 550. The write operation is performed by the processor 320 using a write control line (not shown). In process block 570, a read operation is performed at the second address during the odd cycle. Thus, similar to process block 540, the read operation can be performed and a corresponding comparison performed using the comparator 380, which compares the data written to the data read. In decision block 580, a check is made whether this is the last cycle. For example, in FIG. 1, the memory cycles 110 complete at N, thus, the decision block 580 can check if memory cycle N has been completed. If not, then a loop occurs as shown at 582, wherein the process starts again at process block 510. If decision block 580 is answered in the affirmative, then at 590 the test is complete. Any results of test, including memory bit locations that failed, can be transmitted to an operator performing the test.

Figure 6:
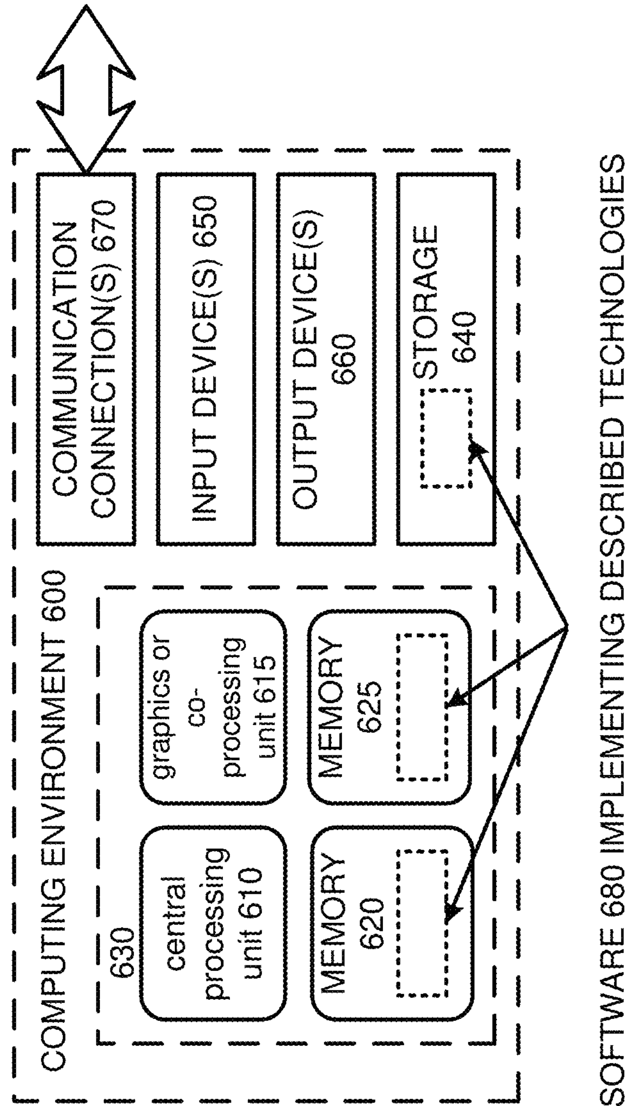
FIG. 6 depicts a generalized example of a suitable computing environment in which the described innovations may be implemented.

FIG. 6 depicts a generalized example of a suitable computing environment 600 in which the described innovations may be implemented. The computing environment 600 is not intended to suggest any limitation as to scope of use or functionality, as the innovations may be implemented in diverse general-purpose or special-purpose computing systems. For example, the computing environment 600 can be any of a variety of computing devices (e.g., desktop computer, laptop computer, server computer, tablet computer, etc.).

With reference to FIG. 6, the computing environment 600 includes one or more processing units 610, 615 and memory 620, 625. In FIG. 6, this basic configuration 630 is included within a dashed line. The processing units 610, 615 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 6 shows a central processing unit 610 as well as a graphics processing unit or co-processing unit 615. The tangible memory 620, 625 may be volatile memory (e.g., registers, cache, RAM), non-volatile memory (e.g., ROM, EEPROM, flash memory, etc.), or some combination of the two, accessible by the processing unit(s). The memory 620, 625 stores software 680 implementing one or more innovations described herein, in the form of computer-executable instructions suitable for execution by the processing unit(s). Any of the components in the computing environment 600 can be used to before the memory tests described herein.

A computing system may have additional features. For example, the computing environment 600 includes storage 640, one or more input devices 650, one or more output devices 660, and one or more communication connections 670. An interconnection mechanism (not shown) such as a bus, controller, or network interconnects the components of the computing environment 600. Typically, operating system software (not shown) provides an operating environment for other software executing in the computing environment 600, and coordinates activities of the components of the computing environment 600.

The tangible storage 640 may be removable or non-removable, and includes magnetic disks, magnetic tapes or cassettes, CD-ROMs, DVDs, or any other medium which can be used to store information in a non-transitory way and which can be accessed within the computing environment 600. The storage 640 stores instructions for the software 680 implementing one or more innovations described herein.

The input device(s) 650 may be a touch input device such as a keyboard, mouse, pen, or trackball, a voice input device, a scanning device, or another device that provides input to the computing environment 600. The output device(s) 660 may be a display, printer, speaker, CD-writer, or another device that provides output from the computing environment 600.

The communication connection(s) 670 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

FIG. 7 is a flowchart according to another embodiment. In process block 710, address lines to a memory are set using a first register during an even cycle. The first register can be an address register that stores a first value following a first pattern. For example, in FIG. 3, the register 330 can be an address register that stores a pattern. One example pattern is shown in FIG. 2 where during even memory test cycles, the address values increment by 2 (i.e., 0, 2, 4, 6, etc.). Using the register 330, the address lines 360 to the memory 310 can be set. In process block 720, the data lines to the memory can be set. For example, in FIG. 2, the data lines can follow a pattern wherein upper bits 230 are toggled such that each bit that is was a 1 on a previous cycle changes to 0 and each 0 changes to a 1. The lower bits 240 follow a pattern that mimics the patterns of the address bits. Thus, the values of the lower bits are identical to the address values. In process block 730, a write operation is performed during the even cycle using the data and address values set in process block 710, 720. In process block 740, the address lines can be set again using a second register during an odd cycle, wherein the second register stores a second value following a second pattern. For example, in FIG. 3, the second register can be register 332 that stores values following a pattern, such as a decrementing pattern of FIG. 2 (i.e., 255, 253, 251). In process block 750, the data lines can be set again. Part of the data used for the data lines is the address. Thus, if the address is 255, then a part of the data is 255. Another part of the data can follow a different pattern or toggle from the previous cycle. In process block 760, a write is performed using the address and data set in process blocks 740, 750. In decision block 770, a check is made whether all of the memory cycles are completed. For example, if every memory address is not yet exercised, then at 772, the registers are updated with a next value in the pattern and the loop repeats at process block 710. Otherwise, if every memory address is exercised, then in process block 780, a readback and comparison is performed. Thus, the entire memory can be written and after all of the writes are complete, then the entire memory can be read and compared to the values written. FIG. 7 is contrary to FIG. 5 wherein reads occur after each write cycle.

For clarity, only certain selected aspects of the software-based implementations are described. Other details that are well known in the art are omitted. For example, it should be understood that the disclosed technology is not limited to any specific computer language or program. For instance, aspects of the disclosed technology can be implemented by software written in C++, Java, Perl, any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only examples of the invention and should not be taken as limiting the scope of the invention. We therefore claim as our invention all that comes within the scope of these claims.

What is claimed is:

1. A method of testing memory, the method comprising:

(a) setting address lines to the memory using a first address value stored in a first register during an even cycle of memory testing, wherein the first register stores address values following a first pattern;

(b) setting data lines to the memory;

(c) performing a write to the memory during the even cycle of the memory testing;

(d) setting the address lines to the memory using a second address value stored in a second register during an odd cycle of memory testing, wherein the second register stores address values following a second pattern, different than the first pattern;

(e) performing a write to the memory at the second address value during the odd cycle of memory testing; and (f) updating the first and second register to next address values in the first and second patterns, respectively; and (g) repeating (a) through (f) for a predetermined number of the even and the odd cycles;

wherein the first pattern is an incrementing pattern and the second pattern is a decrementing pattern or vice versa.

2. The method of claim 1, wherein either or both the first pattern or the second pattern follows a Gray-code based pattern.

3. The method of claim 1, wherein the first register and the second register are within a processor and the method includes selecting either the first register or second register to use based upon a cycle of the memory test.

4. The method of claim 1, wherein the incrementing pattern is an incrementing value that increments a predetermined amount every cycle and the decrementing pattern decrements by the same predetermined amount every cycle.

5. The method of claim 1, further including reading the memory between each write or reading an entirety of the memory after all of the writes are complete.

6. The method of claim 1, wherein the incrementing pattern initiates with a minimum memory address and the decrementing pattern initiates with a maximum memory address.

7. A method, comprising:

testing a memory through a plurality of write cycles where data is written to the memory; and testing the memory through a plurality of read cycles where the data is read from the memory;

wherein, on average, during each of the plurality of write cycles at least a majority of the address bits switch from one cycle to a next cycle;

wherein the plurality of write cycles include even cycles and odd cycles and wherein the address bits during even cycles follow a first pattern of address bits and the address bits during odd cycles follow a second pattern of address bits.

8. The method of claim 7, wherein the first pattern of address bits is an incrementing pattern and the second pattern of address bits is a decrementing pattern.

9. The method of claim 8, wherein the incrementing pattern initiates with a minimum memory address and the decrementing pattern initiates with a maximum memory address.

10. The method of claim 7, wherein the plurality of write cycles includes writing data having a pattern that mimics, at least in part, addresses to which the data is written.

11. The method of claim 10, wherein the data includes upper bits and lower bits, the lower bits have values that mimic the addresses, and the upper bits toggle every cycle.

12. The method of claim 7, wherein either the first pattern or the second pattern follows a Gray-code based pattern.

13. The method of claim 7, further including programming a first register with the first pattern used during the plurality of write cycles and programming a second register with the second pattern used during the plurality of write cycles, wherein the first register is used during the even cycles and the second register is used during the odd cycles.

14. A system, comprising:

a memory including data lines and address lines;

a first register coupled to the memory for storing address values following a first pattern in memory testing, the address values following the first pattern for being applied to the address lines of the memory during even cycles of the memory testing; and a second register for storing address values following a second pattern in the memory testing, the address values following the second pattern for being applied to the address lines of the memory on odd cycles of the memory testing.

15. The system of claim 14, further including an address decoder coupled between the memory and the first and second registers.

16. The system of claim 14, wherein the first and second registers are within a processor.

17. The system of claim 14, wherein the memory is a Random Access Memory (RAM).

18. The system of claim 14, further including a third register for tracking even and odd cycles of the memory testing.

19. The system of claim 14, further including a comparator for comparing values written to the memory during the memory testing and values read from the memory during the memory testing.

* * * * *